United States Patent
Duthie et al.

(10) Patent No.: US 6,483,371 B1
(45) Date of Patent: Nov. 19, 2002

(54) UNIVERSAL TEMPERATURE COMPENSATION APPLICATION SPECIFIC INTEGRATED CIRCUIT

(75) Inventors: Joseph S. Duthie, Algonquin, IL (US); Daniel J. Blase, Algonquin, IL (US); Michael S. Lupescu, Downers Grove, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/676,824

(22) Filed: Oct. 2, 2000

(51) Int. Cl.[7] .............................................. H01L 35/00
(52) U.S. Cl. ...................................... 327/512; 327/513
(58) Field of Search ......................... 327/83, 362, 363, 327/317, 378, 512, 513, 538; 331/66, 176; 341/110

(56) References Cited

U.S. PATENT DOCUMENTS

| | | |
|---|---|---|
| 3,719,838 A | 3/1973 | Peduto et al. |
| 4,454,483 A | 6/1984 | Baylor |
| 4,611,181 A | 9/1986 | Fukumura et al. |
| 4,633,422 A | 12/1986 | Brauer |
| 4,712,078 A | 12/1987 | Slobodik, Jr. et al. |
| 4,746,879 A | 5/1988 | Ma et al. |
| 4,893,097 A | 1/1990 | Zwack |
| 4,922,212 A | 5/1990 | Roberts et al. |
| 4,949,055 A | 8/1990 | Leitl |
| 5,117,206 A | 5/1992 | Imamura |
| 5,170,136 A | 12/1992 | Yamakawa et al. |
| 5,392,005 A | 2/1995 | Bortolini et al. |
| 5,548,252 A | 8/1996 | Watanabe et al. |
| 5,572,169 A | 11/1996 | Iwamoto |
| 5,617,084 A | 4/1997 | Sears |
| 5,619,430 A * | 4/1997 | Nolan et al. ................. 320/150 |
| 5,668,506 A | 9/1997 | Watanabe et al. |
| 5,705,957 A * | 1/1998 | Oka et al. ...................... 331/66 |
| 5,748,047 A * | 5/1998 | Guthrie et al. ................ 331/19 |
| 5,757,244 A | 5/1998 | Nonaka et al. |
| 5,892,408 A * | 4/1999 | Binder ......................... 331/44 |
| 6,066,976 A * | 5/2000 | Cho ............................ 327/350 |

* cited by examiner

Primary Examiner—Matthew Smith
Assistant Examiner—Paul Dinh
(74) Attorney, Agent, or Firm—Stetina Brunda Garred & Brucker

(57) ABSTRACT

A universal temperature compensation circuit for use with a temperature sensor operative to generate an analog temperature signal based on the temperature thereof. The universal temperature compensation circuit comprises an analog to digital converter in electrical communication with the temperature sensor. The analog to digital converter is operative to generate a digital temperature signal from the analog temperature signal. In electrical communication with the analog to digital converter is an electronic storage device containing digital data correlated to temperatures of the temperature sensor. The universal temperature compensation circuit further includes a digital to analog converter in electrical communication with the electronic storage device. The digital to analog converter is operative to generate an analog voltage level from the digital data contained within the electronic storage device. An amplifier is in electrical communication with the digital to analog converter and is operative to buffer and generate a final output voltage level from the analog voltage level. The final output voltage level being correlated to the temperature of the temperature sensor.

27 Claims, 1 Drawing Sheet

UNIVERSAL TEMPERATURE COMPENSATION APPLICATION SPECIFIC INTEGRATED CIRCUIT

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention generally relates to temperature compensation circuitry and more specifically to an application specific integrated circuit (ASIC) temperature compensation circuit for use with voltage controlled attenuators or variable gain amplifiers for the purpose of compensating gain variations over temperature of radio frequency (RF) amplifiers.

Uncompensated RF amplifiers typically have inherent and somewhat predictable gain variations over operating temperatures due to changes in the transconductance of the active devices. The change in amplifier gain varies inversely with the operating temperature (i.e., as temperature increases, gain decreases) and can vary at a rate of between 0.012 to 0.02 dB/°C. for an amplifier with approximately 10 dB of RF gain. The variations in amplifier gain over temperature results in reduced sensitivity and dynamic range for many systems unless adequately compensated. Typically, voltage variable attenuation devices have been used to compensate for gain variations of amplifiers. Alternatively, another technique commonly used is to apply an adjustable bias, relative to operating temperature, to the amplifier itself, which results in the necessary gain compensation to maintain the overall amplifier gain at a relatively constant level.

Prior art temperature compensation circuitry used for the purpose of temperature compensating amplifiers consisted of thermistors and temperature references that generate non-linear drive characteristics for the voltage variable attenuation or amplifier device. These prior art temperature compensation circuits allow the gain variation of the amplifier caused by temperature to be compensated out of the system by appropriately varying the system attenuation via bias voltages. However, the prior art temperature compensation circuitry has been inadequate because it is costly, consumes large amounts of substrate area, and only approximates the desired response. Additionally, the prior art temperature compensation circuitry is inadequate because a new or modified circuit design is required for each application and for each variation in amplifier fabrication.

The present invention addresses the above-mentioned deficiencies in prior art temperature compensation circuitry by providing a circuit which accurately provides the required control voltage to precisely compensate for variations that result from temperature changes. The present invention addresses a technique for generating the required input bias control to a wide variety of voltage controlled gain or attenuator devices for the purpose of accurately adjusting and compensating for gain variations of amplifiers over temperature. This same circuit described herein can be used to temperature compensate other devices (i.e., oscillators, attenuators, phase shifters, etc.) that are subject to variations over temperature. The present invention provides for application specific temperature compensation responses by providing multiple (2 or more), independent precise voltage outputs. Many voltage variable attenuators require multiple voltage inputs that are non-linear and independent (i.e., can not be derived from each other). The present invention is not limited to only 2 outputs and can be expanded to accommodate 3 or more precise outputs that can be adjusted to provide unique voltage output versus temperature transfer curves for each output. Additionally, the present invention provides a temperature compensation circuit that can be fabricated on an Application Specific Integrated Circuit (ASIC), thereby making the circuit less expensive and more compact in size than the prior art.

BRIEF SUMMARY OF THE INVENTION

A universal temperature compensation circuit for use with a temperature sensor operative to generate an analog temperature voltage based on the temperature thereof. The universal temperature compensation circuit comprises an analog to digital converter in electrical communication with the temperature sensor. The analog to digital converter is operative to generate a digital temperature voltage from the analog temperature voltage. In electrical communication with the analog to digital converter is an electronic storage device containing digital values or data correlated to temperatures of the temperature sensor. The universal temperature compensation circuit further includes a digital to analog converter in electrical communication with the electronic storage device. The digital to analog converter is operative to generate an analog voltage level from the digital values or data contained within the electronic storage device. An amplifier is in electrical communication with the digital to analog converter and is operative to amplify and buffer an output voltage level from the analog voltage level. The output voltage level is correlated to the temperature of the temperature sensor by the digital data contained within the electronic storage device. It is contemplated that a demultiplexer be electrically connected between the electronic storage device and the digital to analog converter. In this instance, a second digital to analog converter may be in electrical communication with the demultiplexer and a second amplifier. Accordingly, the second amplifier will be operative to output a second output voltage level that is correlated to the temperature of the sensor but is different than the first output voltage level.

It will be recognized that the electronic storage device may be an EEPROM that is programmed with temperature specific data. The digital temperature signal is used as an address for the EEPROM and addresses the digital value or data stored in the EEPROM that corresponds to the temperature of the sensor.

In order to control the operation of the temperature compensation circuit, there is included a timing circuit. The timing circuit is operative to control the operation of the EEPROM, demultiplexer, and perform temperature sampling in order to output the correct digital data at the correct time. The timing circuit includes a comparator to control the operation of the temperature compensation circuit such that a clock is not required to operate 100% of the time. In the preferred embodiment of the present invention, the temperature compensation circuit is fabricated as an application specific integrated circuit on a single chip.

The temperature compensation circuit is primarily used to drive the control inputs for a voltage variable attenuator located in a RF amplifier chain. In this respect, the electronic storage device is programmed with temperature specific data used to control the attenuator. As will be recognized, the electronic storage device may-be programmed with other temperature specific data in order to control other types of devices.

In accordance with the present invention there is provided a method of correlating a temperature found with a temperature sensor to a prescribed voltage level using the universal temperature compensation circuit. The method comprises the step of generating an analog temperature voltage with the temperature sensor. Next, the analog temperature voltage is converted to a digital temperature signal with the analog to digital converter. Digital data corresponding to the temperature of the temperature sensor is generated by the electronic storage device from the digital temperature signal. Next, the digital data is converted to an analog voltage level with the digital to analog converter. Finally, the analog voltage level is buffered and amplified to generate an output voltage correlated to the temperature of the temperature sensor.

In the preferred embodiment of the present invention, the digital value or data stored within the electronic storage device is generated by addressing the digital value or data with the digital temperature signal. Typically, the electronic storage device is an EEPROM and the digital temperature signal is used to address the EEPROM. If the digital compensation circuit includes a demultiplexer, a second digital to analog converter, and a second amplifier, then the demultiplexer will direct the digital data level to the second digital to analog converter. In this respect, a second final output voltage will be generated by the second amplifier. The second final output voltage may not be equal to the first final output voltage. In the same manner as the second voltage was generated, additional voltages can be generated to control other components that are subject to temperature fluctuations.

BRIEF DESCRIPTION OF THE DRAWING

These as well as other features of the present invention will become more apparent upon reference to the drawing wherein.

DETAILED DESCRIPTION OF THE INVENTION

Figure 1:
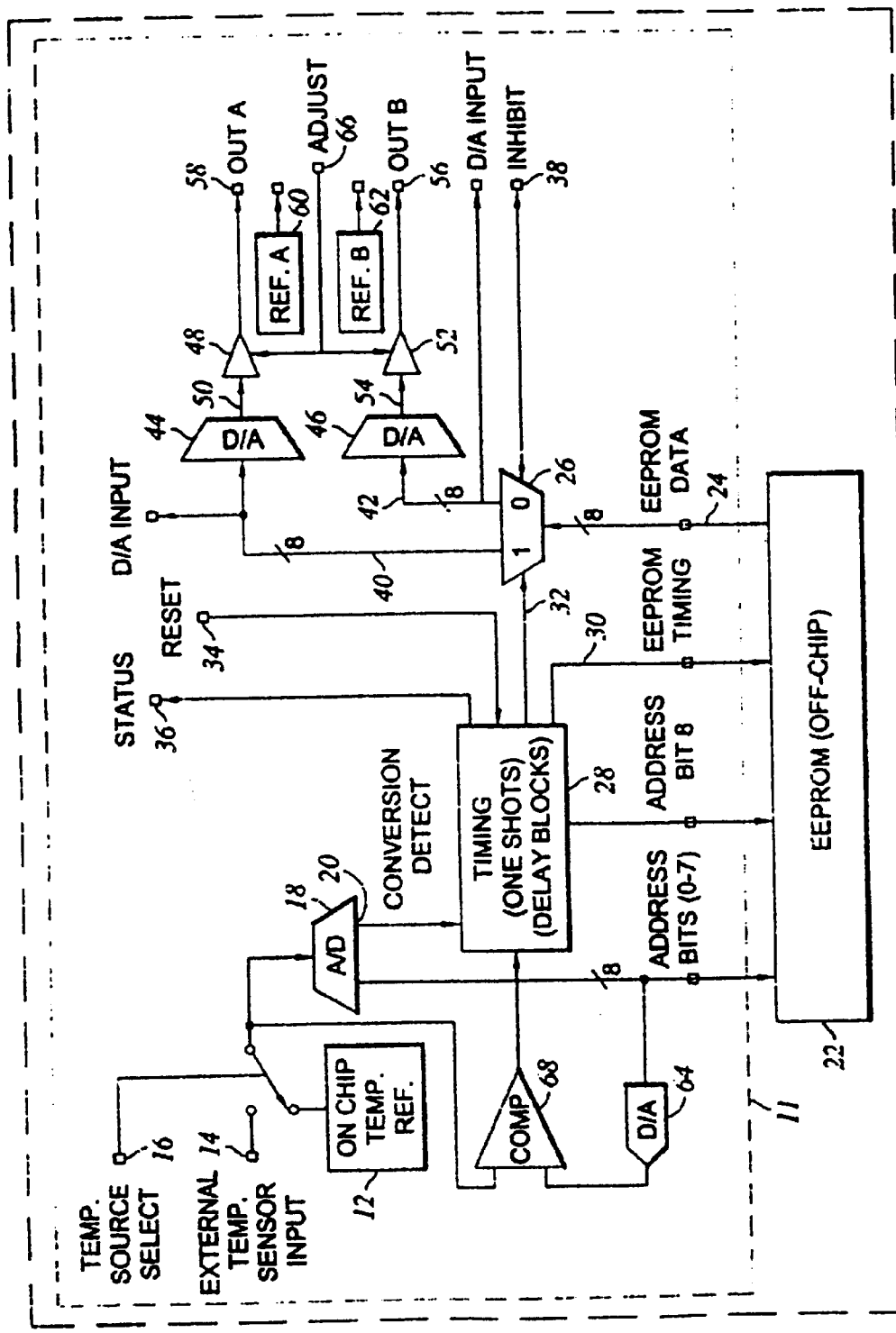
FIG. 1 is a schematic representation of the temperature compensation circuit for the present invention.

Referring now to the drawing wherein the showing is for purposes of illustrating a preferred embodiment of the present invention only, and not for purposes of limiting the same, FIG. 1 schematically represents a universal temperature compensation circuit 10 constructed in accordance with the present invention. The temperature compensation circuit 10 is used to generate at least one output capable of controlling a multitude of electronic functions. In the preferred embodiment, the temperature compensation circuit 10 can be used to control a voltage variable attenuator of a RF amplifier in order to compensate for variations in gain caused by temperature fluctuations in the GaAs amplifier.

In the preferred embodiment of the present invention, the temperature compensation circuit 10 includes an integrated circuit portion 11 fabricated on a single chip. In order to detect the temperature of the RF amplifier, the circuit 10 includes an on-chip temperature reference 12 and an external temperature sensor input 14. The on-chip temperature reference 12 can produce an analog temperature voltage representative of the temperature of the chip. Similarly, the external temperature sensor input 14 may be electrically connected to a temperature monitoring device (not shown) that also produces an analog temperature voltage representative of the temperature of the temperature monitoring device. A temperature source select input 16 is used to determine which temperature source shall be selected. Specifically, the temperature source select input 16 can select between the on-chip temperature reference 12 or the external temperature monitoring device connected to the external temperature sensor input 14.

In electrical communication with the analog temperature voltage supplied from either the external temperature sensor or the on-chip temperature reference 12 is an analog to digital converter 18. The analog to digital converter 18 is operative to convert the analog temperature voltage (from the external temperature sensor input 14 or the on-chip temperature reference 12) into a digital temperature signal. The analog to digital converter 18 is also operative to generate a conversion detection pulse at a conversion detection output 20 of the analog to digital converter 18 when the analog temperature voltage has been converted to the digital temperature signal. The conversion detection pulse is used in the timing of the temperature compensation circuit 10, as will be further explained below.

In electrical communication with the digital temperature signal is an electronic storage device or EEPROM 22. The EEPROM 22 may be external to the integrated circuit portion 11, as shown. Optionally, the EEPROM 22 may be fabricated with the integrated circuit portion 11 such that the temperature compensation circuit 10 is a single application specific integrated circuit. The EEPROM 22 contains data corresponding to a specific temperature sensed by the on-chip temperature reference 12 or the external temperature sensing device. Specifically, the EEPROM 22 will be programmed with a table that correlates the digital temperature signal with a digital value or data contained within the EEPROM 22. As seen in FIG. 1, bits 0–7 from the analog to digital converter 18 are used as an address for the EEPROM 22. The temperature sensed by the on-chip temperature reference 12 or the external temperature sensing device is the address of the digital value or data contained within the EEPROM 22. The digital value or data is retrieved from the EEPROM and presented on an eight bit EEPROM data line 24 that is in electrical communication with a demultiplexer 26.

An analog comparator 68, in conjunction with a digital to analog converter 64, which converts the previous digital data input to the EEPROM 22 into an analog signal for comparison, detects when the input temperature voltage is different from the previously stored temperature data. If the previously stored temperature is different, conversion starts. Otherwise, the circuit 10 is maintained in a low-power sleep mode.

In other words, the analog comparator 68 functions as a mode controller to control the modes, that is, conversion operation mode and low-power sleep mode of the temperature compensation circuit 10. As will be recognized by those of ordinary skill in the art, by eliminating the need for a continuous clock, the generated noise and power consumption of the circuit 10 is greatly reduced. The timing circuit 28 provides an EEPROM timing pulse on an EEPROM timing line 30 that is in electrical communication with the EEPROM 22. Specifically, the EEPROM timing pulse from the timing circuit 28 informs the EEPROM 22 when a digital temperature signal is present at the EEPROM 22. Additionally, as seen in FIG. 1, the timing circuit 28 is in electrical communication with the demultiplexer 26 through a demultiplexer control line 32. The timing circuit 28 generates a demultiplexer control pulse on the demultiplexer control line 32. The demultiplexer 26 will output the digital voltage data from the EEPROM 22 only when a proper signal is sensed on the demultiplexer control line 32. Accordingly, the timing circuit 28 can control the output a of the demultiplexer 26.

The timing circuit 28 functions as a controller for the temperature compensation circuit 10 by providing a reset input 34 and a status input 36. The reset input 34 allows a user to reset the timing circuit 28 and therefore the temperature compensation circuit 10. The status output 36 provides a signal that indicates the status of the temperature compensation circuit 10. To further control the operation of the temperature compensation system 10, the demultiplexer 26 is in electrical communication with an inhibit input 38 that is operative to prevent the demultiplexer 26 from outputting the digital voltage data from the EEPROM 22.

Referring to FIG. 1, the demultiplexer 26 contains a first 8 bit demultiplexer data line 40 and a second 8 bit demultiplexer data line 42. Each of the data lines 40 and 42 are in electrical communication with a respective first digital to analog converter 44 and a second digital to analog converter 46. In this respect, the first digital to analog converter 44 is connected to the demultiplexer 26 by the first demultiplexer data line 40 and the second digital to analog converter 46 is connected to the demultiplexer 26 by the second demultiplexer data line 42. Accordingly, the digital value or data from the EEPROM 22 is transferred to the first and second digital to analog converters 44, 46.

Each of the first and second digital to analog converters 44, 46 are operative to convert the digital value or data from the EEPROM 22 to an analog voltage level. Referring to FIG. 1, the first digital to analog converter 44 is connected to a first operational amplifier (op-amp) 48 by a first analog data line 50. Similarly, the second digital to analog converter 46 is connected to a second op-amp 52 by a second analog data line 54. Each of the first and second op-amps 48, 52 are operative to buffer and/or scale and level shift the analog voltage level from a respective one of the digital to analog converters 44, 46. In this respect, the first op-amp 48 produces a first output voltage level at a first output 58 and the second op-amp 52 produces a second output voltage level at a second output 56. Each of the op-amps 48, 52 is operative to generate a final output voltage level in a desired voltage range.

In the preferred embodiment of the present invention, the first and second final outputs 58, 56 are electrically connected to a voltage variable gain control device (i.e., attenuator or amplifier) for a RF amplifier. The first and second final outputs 58, 56 provide a precise voltage level to control the voltage variable control device (i.e., attenuator) such that variations in gain in the amplifier caused by temperature can be compensated.

In the preferred embodiment of the present invention, the EEPROM 22 contains temperature specific data that correlates the temperature sensed by either the external temperature source or the on-chip temperature reference 12 to a final output voltage that operates the attenuator for the RF amplifier. Accordingly, the digital value or data stored within the EEPROM 22 are correlated to temperatures found in the amplifier. The digital data will represent a control voltage needed by the voltage controlled attenuator of the amplifier in order to provide stable RF gain over temperature for the RF amplifier. Therefore, the temperature compensation circuit 10 is operative to produce a final output voltage that controls the voltage variable attenuator of an amplifier.

It will be recognized by those of ordinary skill in the art that the temperature compensation circuit 10 can be used to control other types of devices rather than attenuators. The EEPROM 22 will contain control voltages used to operate the specific device connected to either the first and/or second output 58, 56. Accordingly, the temperature compensation circuit 10 can be used for various applications by reprogramming the EEPROM 22. If the EEPROM 22 is an external chip, then the EEPROM 22 will only need to be reprogrammed for the specific application. In addition, the present invention can be easily extended to provide greater than 2 independent outputs to control other temperature sensitive components within the electronic circuit.

The universal temperature compensation circuit also provides an adjust input 66, that will enable the user to further refine the voltage outputs 58, 56 of the circuit to more precisely compensate the overall gain variation of the amplifier. This feature is particularly useful at the next higher level of assembly where the effects of varying temperature on other system components can be compensated without needing to reprogram the EEPROM 22.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A universal temperature compensation circuit for use with a temperature sensor, the temperature sensor being operative to generate an analog temperature voltage based on the temperature thereof, the circuit comprising:

an analog to digital converter in electrical communication with the temperature sensor, the analog to digital converter being operative to generate a digital temperature signal from the analog temperature voltage;

an electronic storage device in electrical communication with the analog to digital converter, the electronic storage device containing a plurality of digital data, each one of the digital data correlated to a respective temperature of the temperature sensor;

a digital to analog converter in electrical communication with the electronic storage device, the digital to analog converter being operative to generate an analog voltage level from the digital data contained within the electronic storage device;

an amplifier in electrical communication with the digital to analog converter, the amplifier being operative to buffer an output voltage level from the analog voltage level wherein the output voltage level is correlated to the temperature sensor; and an analog comparator and an additional digital to analog converter circuit operative to detect a change in the input temperature voltage in order to begin operation of the temperature compensation circuit.

2. The temperature compensation circuit of claim 1 wherein the output voltage is configured as a voltage variable gain control signal.

3. The temperature compensation circuit of claim 2 wherein the electronic storage device is an EEPROM programmed with temperature specific data to control the voltage variable gain device of the RF amplifier.

4. The temperature compensation circuit of claim 1 wherein the electronic storage device is an EEPROM.

5. The temperature compensation circuit of claim 4 wherein the EEPROM is programmed with temperature specific data.

6. The temperature compensation circuit of claim 1 wherein the digital temperature signal is an address of the corresponding digital data stored in the electronic storage device.

7. The temperature compensation circuit of claim 1 wherein the circuit is fabricated as an application specific integrated circuit.

8. The temperature compensation circuit of claim 1 wherein the digital data is first digital data, the analog to digital converter is a first analog to digital converter, the amplifier is a first amplifier, and the output voltage level is a first output voltage level, the temperature compensation circuit further comprising:
   a second digital to analog converter in electrical communication with the electronic storage device, the second analog to digital converter being operative to generate a second analog voltage level; and
   a second amplifier in electrical communication with the second digital to analog converter, the second amplifier being operative to buffer a second output voltage level correlated to the temperature of the temperature sensor.

9. The temperature compensation circuit of claim 8 wherein the first output voltage level is not derived from the second output voltage level.

10. The temperature compensation circuit of claim 9 further comprising a demultiplexer in electrical communication with the electronic storage device and the first and second digital to analog converters, the demultiplexer being operative to direct the digital data to a respective one of the first and second digital to analog converters.

11. The method of claim 1 wherein the temperature condensation circuit defaults to a low power consumption mode until a temperature difference is detected.

12. A method of correlating a temperature detected with a temperature sensor to a prescribed voltage level using a universal temperature compensation circuit having an analog to digital converter, an electronic storage device, a digital to analog converter and an amplifier, the method comprising the steps of:
   a) generating an analog temperature voltage with the temperature sensor;
   b) converting the analog temperature voltage to a digital temperature signal with the analog to digital converter;
   c) generating digital data corresponding to the temperature of the temperature sensor from the digital temperature signal with the electronic storage device;
   d) converting the digital data to an analog voltage level with the digital to analog converter; and
   e) buffering the analog voltage level to produce an output voltage correlated to the temperature of the temperature sensor; wherein
      step d) further comprises converting a first analog voltage level with the first digital to analog converter and converting the digital data to a second analog voltage level with the second digital to analog converter; and
      step e) further comprises buffering the first analog voltage level with the first amplifier to generate a first output voltage and amplifying the second analog voltage level with the second amplifier to generate a second output voltage.

13. The method of claim 12 wherein step (c) comprises addressing the digital data stored within the electronic storage device with the digital temperature signal.

14. The method of claim 13 wherein the electronic storage device is an EEPROM and step (c) comprises addressing the EEPROM with the digital temperature signal.

15. The method of claim 14 wherein the EEPROM is programmed with temperature specific data for a voltage variable gain device of the RF amplifier and step (c) comprises addressing the temperature specific data with the digital temperature signal.

16. The method of claim 12 wherein step (e) further comprises buffering the first and second output voltage levels such that the first output voltage level is not substantially equal to the second output voltage level.

17. The method of claim 12 wherein the temperature compensation circuit further comprises a demultiplexer and step (c) further comprises directing the digital data to a respective one of the digital to analog converters with the demultiplexer.

18. An universal temperature compensation circuit, providing independent temperature compensation responses to respectively control input of at least one voltage variable gain control signal subject to variations over temperature, comprising:
   an electronic storage device, operative to output a digital signal corresponding to the variations over temperature;
   at least one output terminal, operative to provide the independent temperature compensation responses to the voltage variable gain control signal, wherein the independent temperature compensation responses are obtained by processing the digital signal output from the electronic storage device; and
   a mode control device, operative to determine whether the universal temperature compensation circuit is entering a sleep mode in accordance with the variations over temperature, the mode control device including a comparator operative to compare a current temperature level and a previous temperature level stored in the electronic storage device.

19. The circuit according to claim 18, further comprising a timing circuit, operative to control output of the digital signal of the electronic storage device.

20. The circuit according to claim 19, further comprising at least one demultiplexor, operative to output the digital data from the electronic storage device to the output terminal, wherein the demultiplexor is controlled by a demultiplexer control pulse generated by the timing circuit.

21. The circuit according to claim 20, wherein the demultiplexor provides a plurality of data lines for outputting the digital data when a plurality of gain variable devices are controlled by the universal temperature compensation circuit.

22. The circuit according to claim 20, further comprising an inhibit input operative to prevent the demultiplexer from outputting the digital voltage data from the electronic storage device.

23. The circuit of claim 20, wherein when more than one digital to analog converter are provided when a plurality of data lines are provided by the demultiplexor.

24. The circuit of claim 19, further comprising a reset input, operative to reset the timing circuit.

25. The circuit of claim 19, further comprising a status output, operative to provide a signal indicating a status of the universal temperature compensation circuit.

26. A universal temperature compensation circuit, operative to provide at least one analog temperature compensation voltage based on a temperature level detected by a temperature sensor, the circuit comprising:
   an electronic storage device, operative to output a corresponding digital data correlated to a digital temperature signal converted from the temperature level detected by the temperature sensor;

at least one output terminal, operative to provide the analog temperature compensation voltage obtained by processing the digital data;

a timing circuit, operative to control timing of output of the corresponding digital data from the electronic storage device; and an analog to digital converter in electrical connection with the electronic storage device and the timing circuit to convert the temperature level into the digital temperature signal, and to output a conversion detection pulse to the timing circuit when the temperature level has been converted into the digital temperature signal.

27. The circuit of claim 26, further comprising a demultiplexor connected between the electronic storage device and the output terminal, and in electrical connection with the timing circuit, wherein the demultiplexor is operative to output the digital data from the electronic storage device to the output terminal according to a control pulse output generated by the timing circuit.

* * * * *